United States Patent
Oh et al.

(10) Patent No.: US 11,217,517 B2
(45) Date of Patent: Jan. 4, 2022

(54) SEMICONDUCTOR PACKAGE WITH A TRENCH PORTION

(71) Applicant: Samsung Electronics Co., Ltd., Suwon-si (KR)

(72) Inventors: Juhyeon Oh, Asan-si (KR); Woojin Choi, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/835,915

(22) Filed: Mar. 31, 2020

(65) Prior Publication Data

US 2021/0035895 A1 Feb. 4, 2021

(30) Foreign Application Priority Data

Jul. 31, 2019 (KR) ........................ 10-2019-0093098

(51) Int. Cl.
| | |
|---|---|
| *H01L 23/498* | (2006.01) |
| *H01L 23/00* | (2006.01) |
| *H01L 23/31* | (2006.01) |
| *H01L 25/10* | (2006.01) |
| *H01L 23/482* | (2006.01) |
| *H01L 23/14* | (2006.01) |
| *H01L 25/065* | (2006.01) |
| *H01L 23/528* | (2006.01) |

(52) U.S. Cl.
CPC .... *H01L 23/49816* (2013.01); *H01L 23/3121* (2013.01); *H01L 23/49861* (2013.01); *H01L 24/05* (2013.01); *H01L 24/13* (2013.01); *H01L 24/45* (2013.01)

(58) Field of Classification Search
CPC ............... H01L 25/0657; H01L 25/162; H01L 2225/06503–06548; H01L 23/498–49827; H01L 23/49861; H01L 23/31; H01L 23/315
See application file for complete search history.

(56) References Cited

U.S. PATENT DOCUMENTS

| | | | |
|---|---|---|---|
| 7,185,426 B1 | 3/2007 | Hiner et al. | |
| 7,749,808 B2 | 7/2010 | Corisis et al. | |
| 7,750,455 B2 * | 7/2010 | Pagaila | H01L 25/0657 257/686 |
| 8,034,660 B2 | 10/2011 | Takahashi | |
| 8,050,047 B2 | 11/2011 | Chow et al. | |

(Continued)

*Primary Examiner* — Sonya McCall-Shepard
(74) *Attorney, Agent, or Firm* — Muir Patent Law, PLLC

(57) ABSTRACT

A semiconductor package may include a substrate having an upper surface on which a plurality of first pads are disposed and a lower surface on which a plurality of second pads are disposed. The semiconductor package may further include a semiconductor chip disposed on the upper surface of the substrate on which connection electrodes connected to a first set of the plurality of first pads are disposed. The semiconductor package may include an interposer having an upper surface on which a plurality of first connection pads, connected to a second set of the plurality of first pads, and a plurality of second connection pads are disposed. The semiconductor package may further include a plurality of connection terminals disposed on a set of the plurality of second connection pads of the interposer, and a molding material disposed on the upper surface of the substrate.

18 Claims, 23 Drawing Sheets

(56) References Cited

U.S. PATENT DOCUMENTS

| | | | |
|---|---|---|---|
| 8,884,419 | B1 | 11/2014 | Liou et al. |
| 9,070,627 | B2 | 6/2015 | Zhao et al. |
| 9,337,135 | B2 | 5/2016 | Lii et al. |
| 9,842,798 | B2 | 12/2017 | Marimuthu et al. |
| 10,049,964 | B2 | 8/2018 | Shim et al. |
| 10,083,903 | B1 | 9/2018 | Yoon et al. |
| 2009/0127686 | A1 | 5/2009 | Yang et al. |
| 2017/0117261 | A1 | 4/2017 | Yu et al. |
| 2018/0053753 | A1 | 2/2018 | Singh et al. |
| 2020/0328187 | A1* | 10/2020 | Cho .................. H01L 23/3128 |

\* cited by examiner

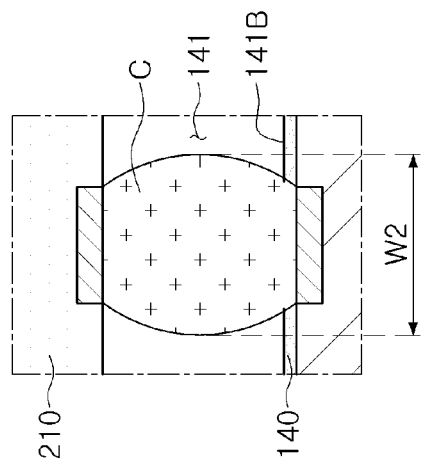
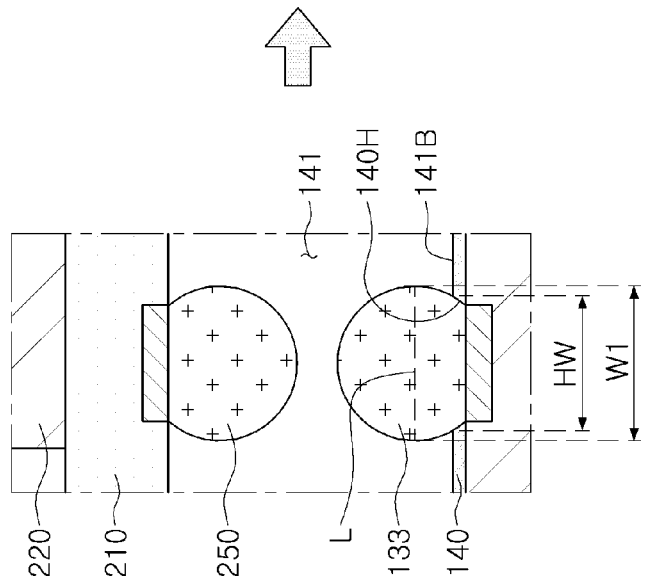
FIG. 12B
FIG. 12A

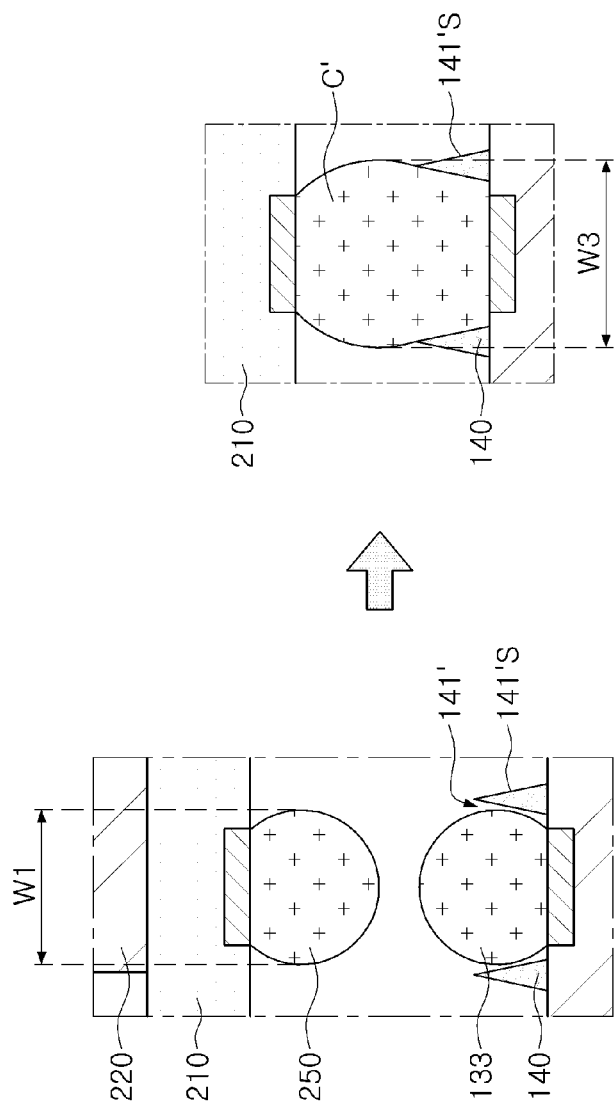

SEMICONDUCTOR PACKAGE WITH A TRENCH PORTION

CROSS-REFERENCE TO RELATED APPLICATION(S)

This application claims benefit of priority to Korean Patent Application No. 10-2019-0093098 filed on Jul. 31, 2019 in the Korean Intellectual Property Office, the disclosure of which is incorporated herein by reference in its entirety.

BACKGROUND

1. Field

The present inventive concept relates to a semiconductor package.

2. Description of Related Art

With the development of the electronics industry, there is a growing demand for high-performance, high-speed and miniaturization of electronic components. According to this trend, a package such as a stack package for mounting a plurality of semiconductor chips on a single interposer; or a package substrate and a package on package (POP) for stacking a plurality of packages have emerged in the semiconductor package field. On the other hand, in the POP structure, as the external connection terminals of an upper package and a lower package are fused with each other, shorts may occur with adjacent external connection terminals.

SUMMARY

An aspect of the present inventive concept is to provide a semiconductor package capable of preventing shorts from occurring between external connection terminals of a semiconductor package.

According to an aspect of the present inventive concept, a semiconductor package may be disclosed. The semiconductor package may include a substrate having an upper surface on which a plurality of first pads are disposed and a lower surface on which a plurality of second pads, electrically connected to the plurality of first pads, are disposed. The semiconductor package may further include a semiconductor chip disposed on the upper surface of the substrate, the semiconductor chip having a first surface on which connection electrodes connected to a first set of the plurality of first pads are disposed and a second surface opposite to the first surface. The semiconductor package may include an interposer disposed on the second surface of the semiconductor chip, the interposer having an upper surface on which a plurality of first connection pads, connected to a second set of the plurality of first pads, and a plurality of second connection pads are disposed, the interposer having a lower surface opposite to the upper surface and facing the second surface of the semiconductor chip, and having a width greater than a width of the semiconductor chip in at least one direction. The semiconductor package may further include a plurality of connection terminals disposed on a set of the plurality of second connection pads of the interposer, and a molding material disposed on the upper surface of the substrate. The molding material covering at least the upper surface of the interposer, and having at least one trench portion exposing two or more adjacent connection terminals of the plurality of connection terminals.

According to an aspect of the present inventive concept, a semiconductor package may be disclosed. The semiconductor package may include a substrate having an upper surface and a lower surface, each of the upper surface and the lower surface being provided with a plurality of pads. The semiconductor package may further include a semiconductor chip disposed on the upper surface of the substrate that is electrically connected to the substrate and an interposer disposed on the semiconductor chip, and having an upper surface provided with a plurality of connection pads. The semiconductor package may further include a plurality of connection terminals disposed on at least a first set of the plurality of connection pads of the interposer, and a molding material disposed on the upper surface of the substrate. The molding material covering at least the upper surface of the interposer, and having at least one trench portion exposing the plurality of connection terminals. Additionally, a second set of connection pads of the plurality of connection pads of the interposer, not provided with the plurality of connection terminals, may be connected to the substrate.

According to an aspect of the present inventive concept, a semiconductor package, may be disclosed. The semiconductor package may include a substrate having an upper surface and a lower surface, and each of the upper surface and the lower surface may be provided with a plurality of pads. The semiconductor package may further include a semiconductor chip disposed on the upper surface of the substrate that has an upper surface provided with a plurality of connection pads. The semiconductor package may further include a plurality of connection terminals disposed on the upper surface of the semiconductor chip that are connected to at least a subset of the plurality of connection pads, and a molding material having a trench portion covering at least the upper surface of the semiconductor chip and exposing at least a portion of the plurality of connection terminals.

BRIEF DESCRIPTION OF DRAWINGS

The above and other aspects, features and other advantages of the present disclosure will be more clearly understood from the following detailed description, taken in conjunction with the accompanying drawings, in which:

FIGS. 12A, 12B, 13A, and 13B are cross-sectional views illustrating a state before (a) and after (b) fusion of a first upper connection terminal and a second lower connection terminal in portion "A" of FIGS. 9 and 10 to explain the effect due to a trench portion employed in an embodiment of the present disclosure;

DETAILED DESCRIPTION

Hereinafter, the example embodiments of the present disclosure will be described in detail with reference to the attached drawings.

Figure 1:
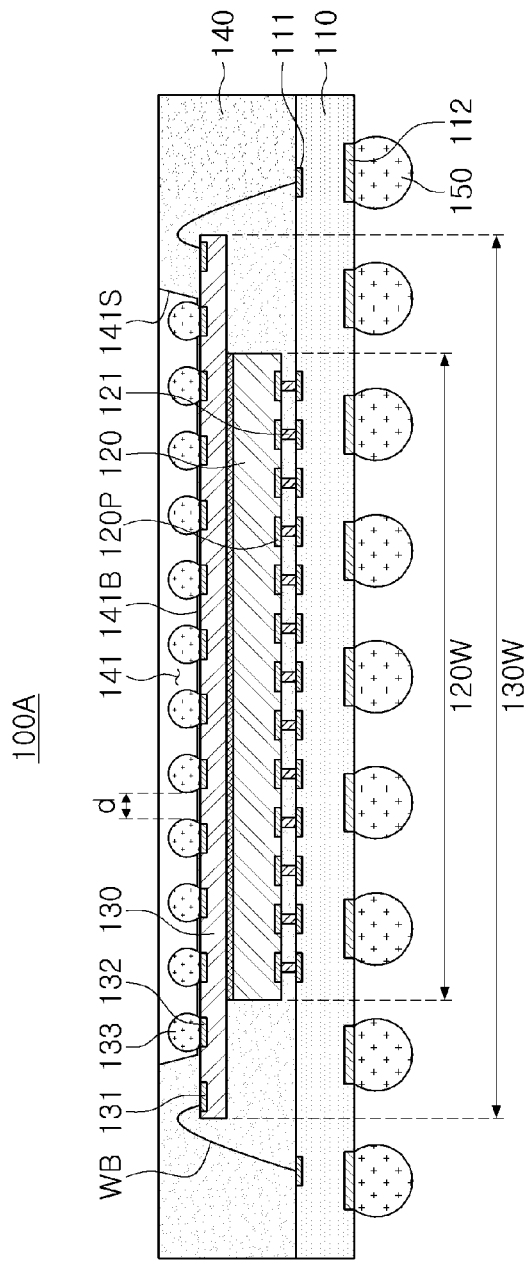
FIG. 1 is a side cross-sectional view illustrating a semiconductor package according to an embodiment of the present disclosure.

FIG. 1 is a side cross-sectional view illustrating a semiconductor package 100A according to an embodiment of the present disclosure, and FIGS. 2A to 2D are top plan views of a semiconductor package, in which various shapes of a trench portion are illustrated. Here, FIG. 1 is a cross-sectional view of the semiconductor package of FIGS. 2A to 2D, taken along line I-I'.

Referring to FIG. 1, a semiconductor package 100A according to an embodiment of the present disclosure includes a substrate 110, a semiconductor chip 120, an interposer 130, and a molding material 140. In addition, lower connection terminals 150 may be further included.

The substrate 110 may include a plurality of first pads 111, a plurality of second pads 112, and wirings (not shown) electrically connecting the plurality of first pads 111 to the plurality of second pads 112. The substrate 110 may be a substrate for a semiconductor package such as a printed circuit board (PCB), a ceramic board, a tape wiring board, or the like. For example, the substrate 110 may include a thermosetting resin such as an epoxy resin, a thermoplastic resin such as polyimide, or a photosensitive insulating layer. In detail, the substrate may include a material such as prepreg, an Ajinomoto build-up film (ABF), FR-4, Bismaleimide Triazine (BT), a Photo Imageable Dielectric (PID) resin, or the like.

The plurality of first pads 111 may be disposed on an upper surface of the substrate 110, and may be electrically and/or physically connected to the semiconductor chip 120.

The plurality of first pads 111 may have a horizontal width less than a horizontal width of the plurality of second pads 112. Thus, when a semiconductor package is connected to an external board such as a mainboard, the difference in circuit width between the semiconductor chip and the external substrate may be compensated for.

The plurality of second pads 112 may be disposed on a lower surface of the substrate 110, and may be electrically and/or physically connected to lower connection terminals 150.

The plurality of second pads 112 may be electrically connected to an external device such as a mainboard through the lower connection terminals 150. For example, the lower connection terminals 150 may have a flip-chip connection structure having a solder ball, a conductive bump, or a grid array such as a pin grid array, a ball grid array, or a land grid array. The various "pads" described herein may be connected to internal circuitry within the device to which they are connected, and may transmit signals and/or supply voltages to and/or from the device to which they are attached. For example, substrate pads disposed on the package substrate may connect to rerouting and other electrical lines disposed within the package substrate, and the pads disposed on the semiconductor chips may connect to an integrated circuit on one or more of the semiconductor chips. The various pads described herein may generally have a planar surface at a location for connecting to a terminal for external communications outside of the device to which the pads are connected. The pads may be formed of a conductive material, such as metal, for example.

The semiconductor chip 120 may have an active surface provided with connection electrodes 120P and an inactive surface opposite to the active surface. The semiconductor chip 120 may be a logic chip or a memory chip. For example, the semiconductor chip 120 may include a system Large scale integration (LSI), a logic circuit, a CMOS imaging sensor (CIS), a memory device such as DRAM, SRAM, flash, PRAM, ReRAM, FeRAM, MRAM, a high bandwidth memory (HBM), a Hybrid memory cubic (HMC), or the like, or a Microelectromechanical system (MEMS) device.

The connection members 121 may be disposed on the connection electrodes 120P. The connection members 121 may include a solder ball, or a copper pillar, and the semiconductor chip 120 may be mounted on the substrate 110 in a manner of flip-chip bonding through the same. For example, between the active surface of the semiconductor chip 120 and the upper surface of the substrate 110, connection members 121 connecting the connection electrodes 120P to at least a portion of the plurality of first pads 111 may be disposed. Meanwhile, although not illustrated in the drawings, an underfill resin surrounding the connection members 121 may be formed between the active surface of the semiconductor chip 120 and the upper surface of the substrate 110. The connection members 121 may be formed of conductive material, and may be, for example, conductive interconnectors (e.g., conductive wiring).

However, embodiments of the present disclosure are not limited thereto, and the semiconductor chip 120 may be mounted on the substrate 110 in a manner of wire bonding in various embodiments of the present disclosure.

The interposer 130 may include a plurality of first connection pads 131 and a plurality of second connection pads 132 and a plurality of upper connection terminals 133 (also referred to herein as a "connection terminal"), disposed on an upper surface of the interposer. The interposer 130 may have an upper surface and a lower surface, opposing each other. The interposer 130 may be a substrate including a semiconductor material or an insulating material, or a semiconductor chip. For example, the interposer may include silicon, germanium, silicon-germanium, gallium-arsenic (GaAs), glass, ceramic, or the like.

Although it is illustrated in the drawings that the first and second connection pads 131 and 132 are disposed on an upper surface of the interposer 130, connection pads may be additionally disposed on a lower surface of the interposer 130. In addition, although not illustrated in the drawings, the interposer 130 may be understood to include a wiring circuit (not shown) connecting the plurality of first and second connection pads 131 and 132 to each other.

The interposer 130 may have a width greater than a width of the semiconductor chip 120 in at least one direction. For example, the interposer 130 may have a horizontal width 130W greater than a horizontal width 120W of the semiconductor chip 120. Thus, a space for arranging the plurality of first and second connection pads 131 and 132 may be sufficiently secured on an upper surface and/or a lower surface of the interposer 130.

The plurality of first connection pads 131 may be disposed close to an edge on a plane of the interposer 130, while the plurality of second connection pads 132 may be disposed in an interior surrounded by the plurality of first connection pads 131 on a plane of the interposer 130. In addition, the plurality of first connection pads 131 may be disposed on the plane of the interposer 130 and be located outside of a region overlapping the semiconductor chip in a vertical direction.

The upper connection terminals 133 may be disposed on at least a portion (e.g., a set) of the plurality of second connection pads 132. The plurality of first connection pads 131, not provided with the upper connection terminals 133, may be connected to a portion (e.g., a set) of the plurality of first pads 111 of the substrate 110. Each upper connection terminal of the upper connection terminals 133 may be, for example, a solder ball. The plurality of first connection pads 131 may be connected to, for example, a portion (e.g., a set) of the plurality of first pads 111 by a bonding wire WB.

In addition, for the reason described below, a distance d between the upper connection terminals 133 may be equal to or less than about 0.2 mm (see description of FIG. 14).

The molding material 140 may cover at least the upper surface of the interposer 130, and may have at least one trench portion 141 exposing at least two or more adjacent connection terminals 133 of the upper connection terminals 133. For example, the molding material 140 may cover an upper surface of the substrate 110, a side surface of the semiconductor chip 120, and an upper surface of the interposer 130, and may fill a space between the semiconductor chip 120 and the substrate 110. The molding material 140 may include an insulating material. For example, an epoxy molding compound (EMC) may be used.

The trench portion 141 may have a lower surface 141B having a stepped portion with respect to an uppermost surface of the molding material 140, and a wall 141S connecting the uppermost surface of the molding material 140 to the lower surface 141B of the trench portion 141. The trench portion 141 may be formed using a laser drill, or the like.

The lower surface 141B of the trench portion 141 may be located at a first level that is higher in elevation than a second level of a contact interface between the upper connection terminals 133 and the plurality of second connection pads 132. For example, a portion of the molding material 140 may be in physical contact with at least a portion of a side surface of the upper connection terminals 133. Thus, an external impact or stress generated in warpage of a semiconductor package is dispersed, so connection reliability of the upper connection terminal 133 may be improved.

In addition, in order to secure an occupation space for the upper connection terminals 133, the lower surface 141B of the trench portion 141 may be located at a first level exposing at least a portion of a side portion of the upper connection terminal 133. In addition, the trench portion 141 may expose an upper region of the upper connection terminal 133 and at least a portion of a lower region of the upper connection terminal 133 based on a line L connecting maximum widths W1 of the upper connection terminals 133 (see FIG. 12A). For example, an upper region of the upper connection terminals 133 and a lower region of the upper connection terminals 133 may be delineated from one another based on a horizontal line L connecting respective maximum widths W1 of the upper connection terminals 133.

In order to secure an occupation space for the upper connection terminals 133, the wall 141S of the trench portion 141 may be spaced apart from the adjacently disposed upper connection terminals 133. The wall 141S of the trench portion 141 may have a shape that is tapered to be closer to the adjacently disposed upper connection terminals 133 toward the lower surface 141B of the trench portion 141 than at the uppermost surface of the molding material 140.

Referring to FIGS. 2A to 2D, the trench portion 141 may have a plurality of bar shapes exposing the upper connection terminals 133 in a line on a plane, and the plurality of bars may be connected to each other.

For example, the upper connection terminals 133 may be arranged in a plurality of rows, and the at least one trench portion 141 may include a plurality of trenches arranged in each of the plurality of rows and exposing upper connection terminals that are disposed in each row.

Figure 2A:
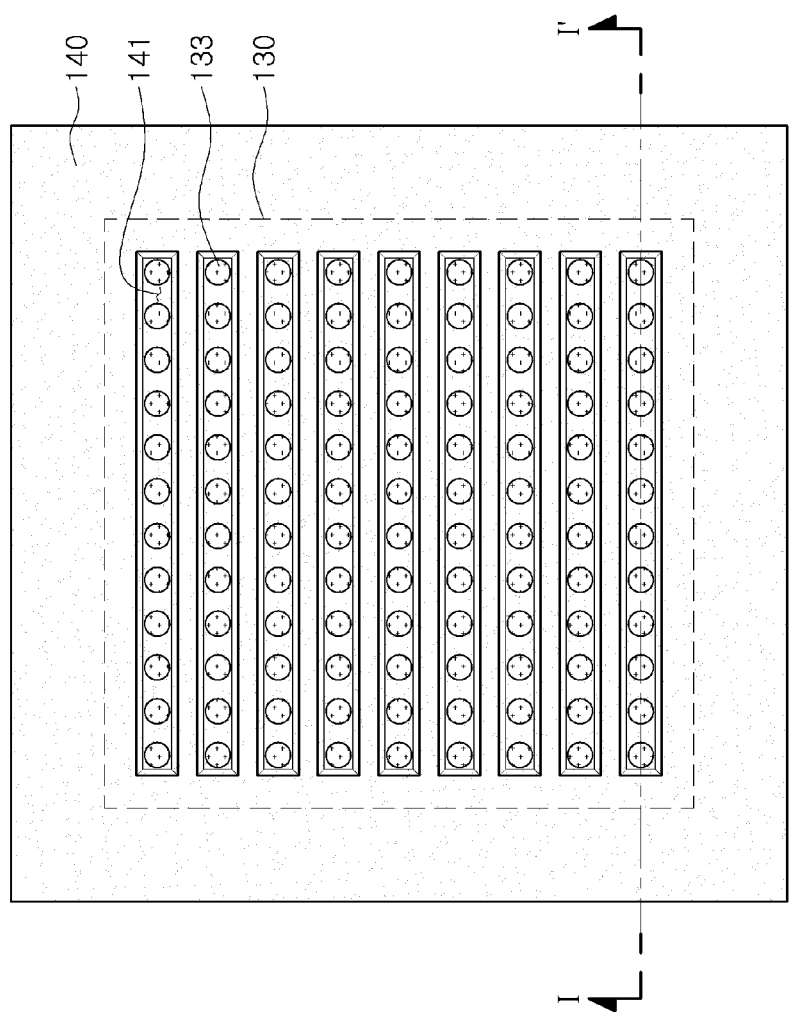
FIGS. 2A to 2D are top plan views of the semiconductor package illustrated in FIG. 1 and illustrate a variously modified shape of a trench portion.
Figure 2B:
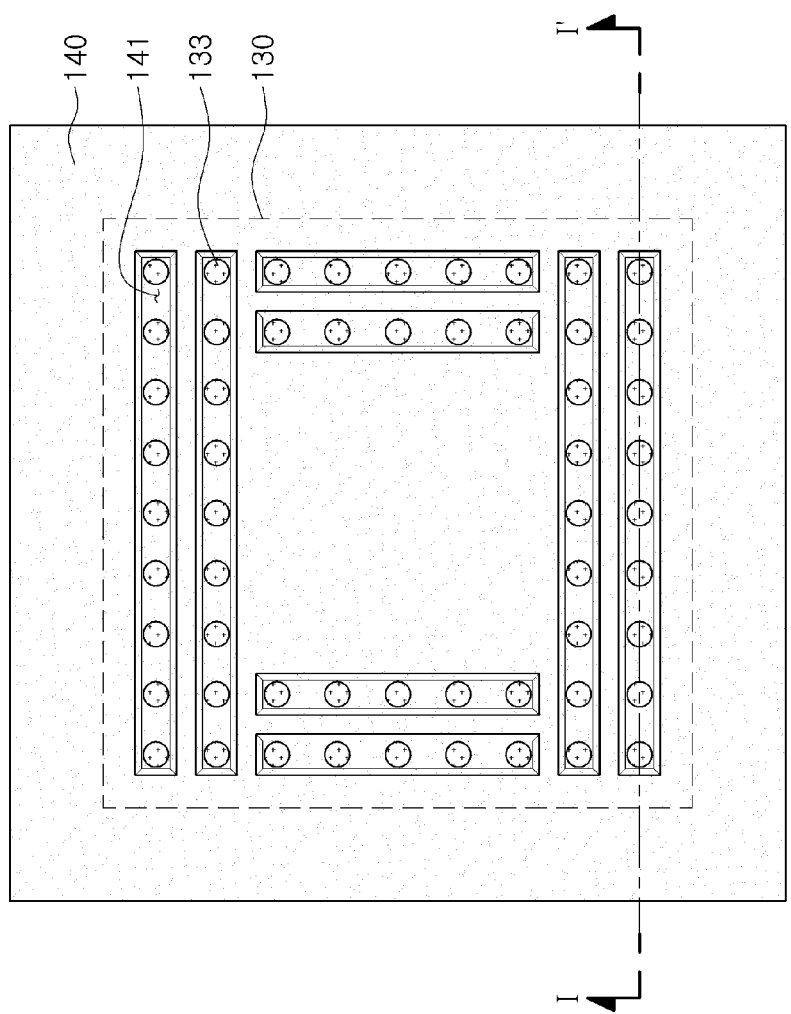
Figure 2C:
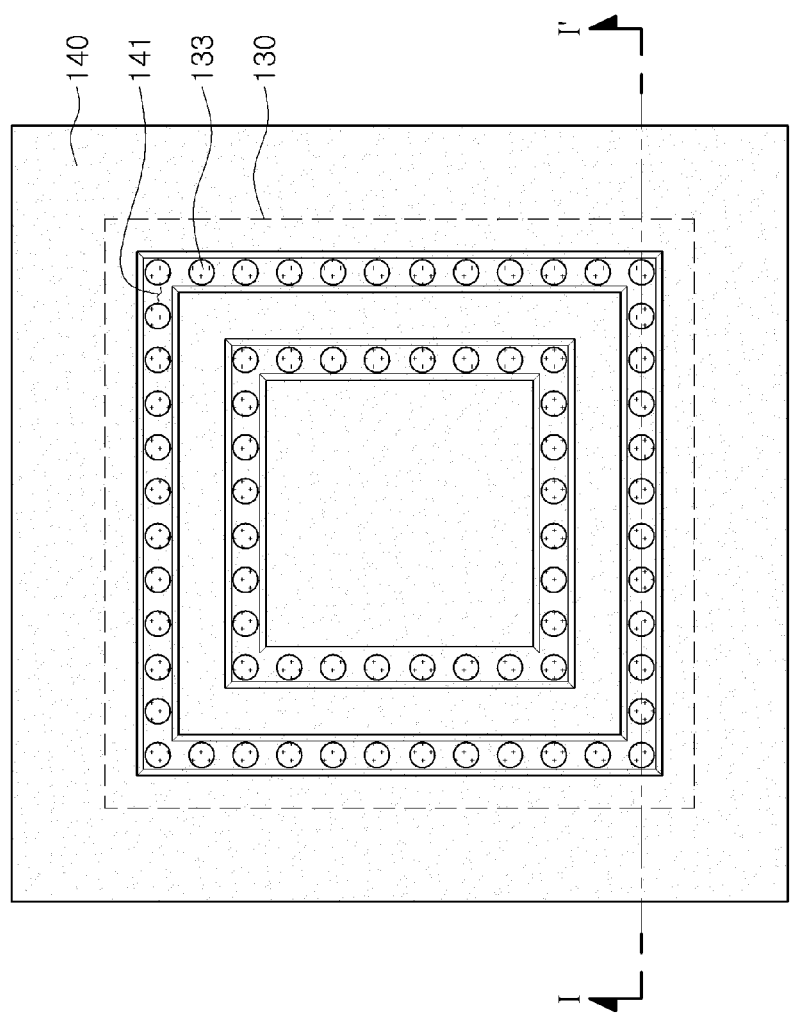
Figure 2D:
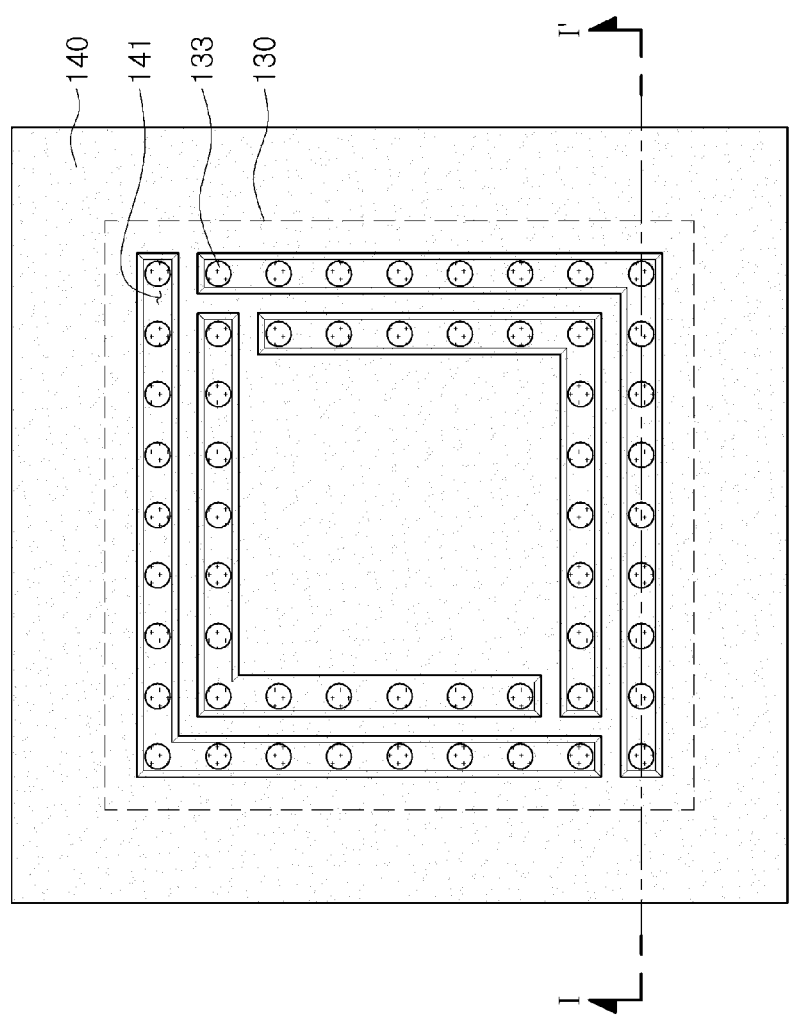

For example, referring to FIG. 2B, the upper connection terminals 133 are disposed in a form of at least one or more grids along an edge of the interposer 130 on a plane of the interposer 130, and the at least one trench portion 141 may include a plurality of trenches arranged in the form of a grid and exposing the plurality of connection terminals 133 disposed at the edge of the plane of the interposer 130.

FIGS. 3 to 8 are schematic side cross-sectional views illustrating a process of manufacturing a semiconductor package 100A according to an embodiment of the present disclosure.

Figure 3:
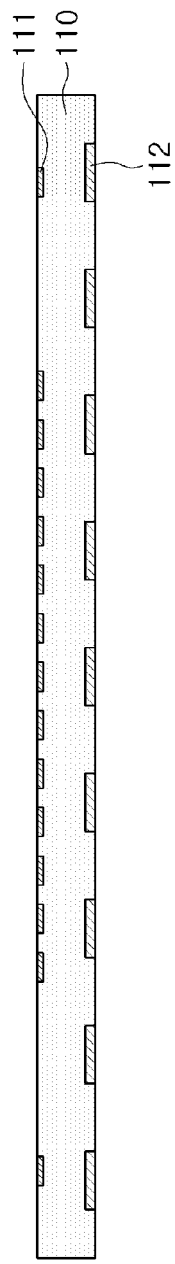
FIGS. 3 to 8 are schematic side cross-sectional views illustrating a process of manufacturing the semiconductor package illustrated in FIG. 1.

Referring to FIG. 3, a substrate 110 having an upper surface provided with a plurality of first pads 111 and a lower surface provided with a plurality of second pads 112, electrically connected to the plurality of first pads 111 may be provided. Although not illustrated in the drawings, the substrate 110 may further include a wiring circuit connecting the first pads 111 to the second pads 112.

Figure 4:
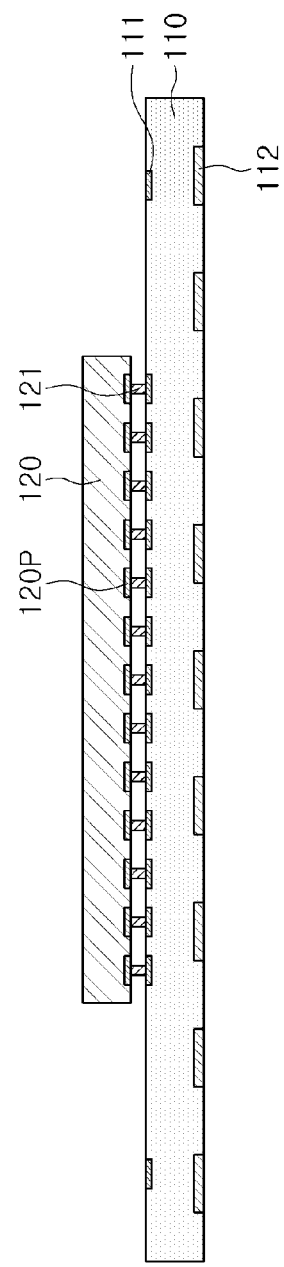

Referring to FIG. 4, a semiconductor chip 120 may be disposed on an upper surface of the substrate 110. The connection electrodes 120P, disposed on a lower surface of the semiconductor chip 120, may be connected to a plurality of first pads 111 on an upper surface of the substrate 110 through the connection members 121. The connection members 121 may be a copper pillar, for example.

Figure 5:
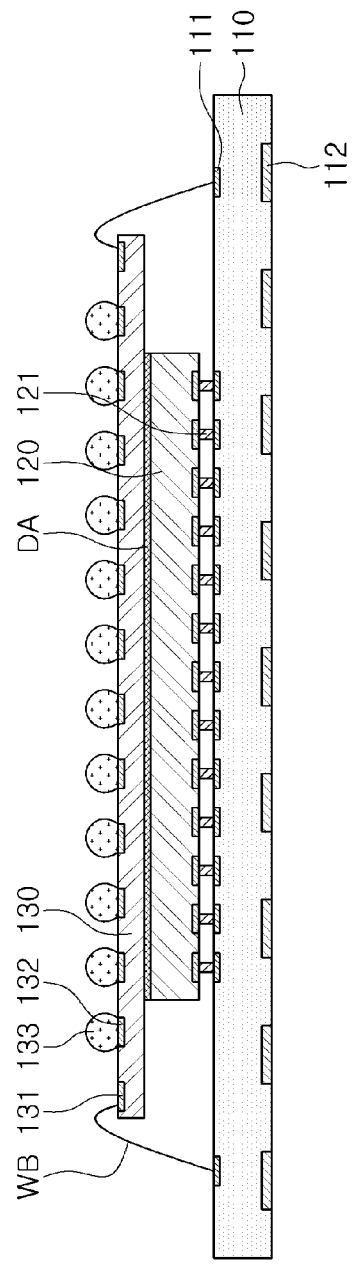

Referring to FIG. 5, an interposer 130 may be disposed on an upper surface of the semiconductor chip 120. An upper surface of the semiconductor chip 120 and a lower surface of the interposer 130 may be bonded by an attaching member DA. The attaching member DA may be, for example, a non-conductive film (NCF), an anisotropic conductive film (ACF), a UV sensitive film, an instantaneous adhesive, a thermosetting adhesive, a laser curing adhesive, an ultrasonic curing adhesive, a nonconductive paste (NCP), or the like.

A plurality of first and second connection pads 131 and 132 may be disposed on the upper surface of the interposer 130. The first connection pads 131 may be disposed outside a region vertically overlapping the semiconductor chip 120, as compared with the second connection pads 132, on a plane of the interposer 130, and the first connection pads 131 may be connected to the plurality of first pads 111 by a bonding wire WB. In addition, upper connection terminals 133 may be formed on the plurality of second connection pads 132 disposed on an inside region of the plane as compared with the first connection pads 131. The upper connection terminals 133 may be a solder ball, for example.

Figure 6:
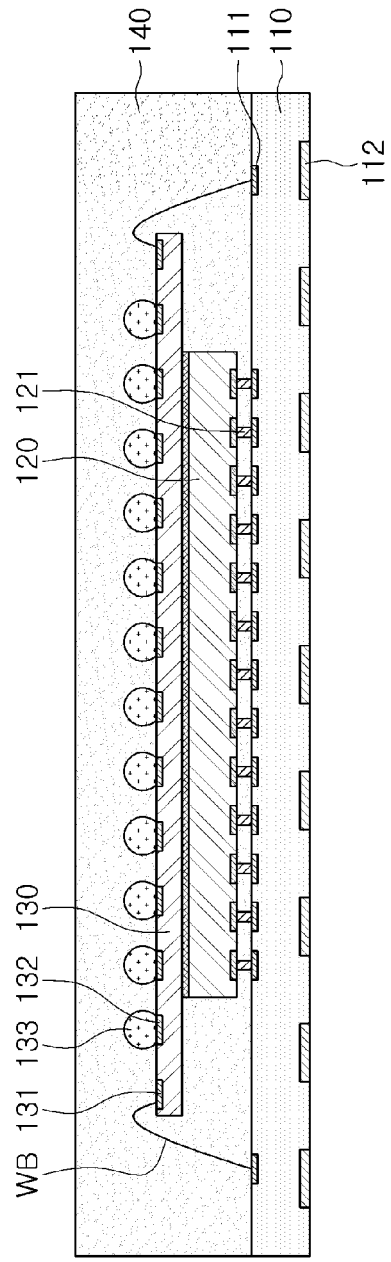

Referring to FIG. 6, a molding material 140 may be formed to cover the substrate 110, the semiconductor chip 120, and the interposer 130. The molding material 140 may be an epoxy molding compound (EMC), for example. The molding material 140 may be formed to cover a plurality of upper connection terminals 133 disposed on an upper surface of the interposer 130.

Figure 7:
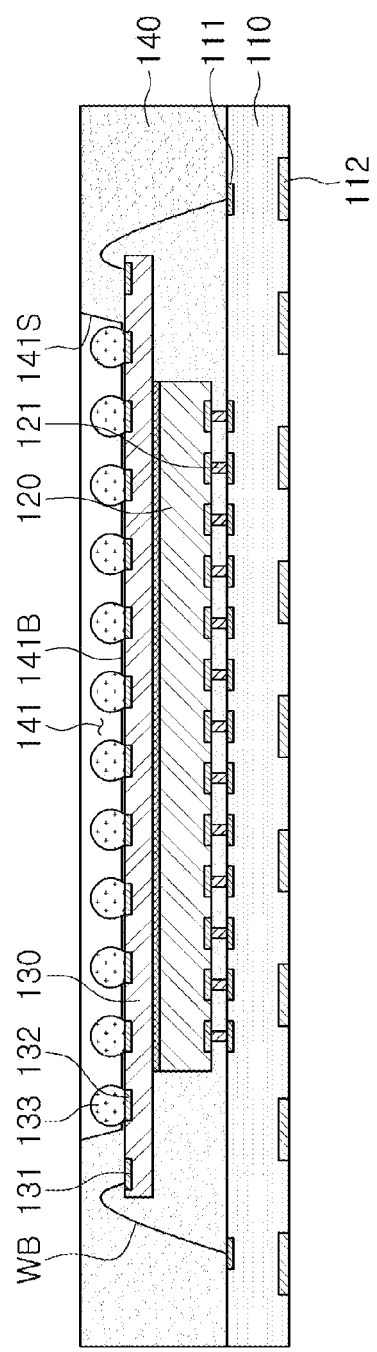

Referring to FIG. 7, a trench portion 141 exposing the upper connection terminals 133 may be formed in an upper portion of the molding material 140. The trench portion 141 may be formed using a laser drill, or the like. A lower surface 141B of the trench portion 141 may be formed to be located on a level that is higher in elevation than a level of a lower surface of the upper connection terminals 133 (when viewed in a side cross-sectional view). Thus, a portion of a side portion of the upper connection terminals 133 is covered by the molding material 140, so connection reliability of the upper connection terminals 133 may be improved.

In addition, the wall 141S of the trench portion 141 is spaced apart from the upper connection terminals 133 adjacent thereto, and may have a shape tapered to be closer to the adjacently disposed upper connection terminal 133 toward the lower surface 141B of the trench portion 141 than at a higher portion of the molding material. For example, the horizontal width of the trench portion 141 may increase from the lower most portion of the trench portion 141 to the upper most portion of the trench portion 141.

Figure 8:
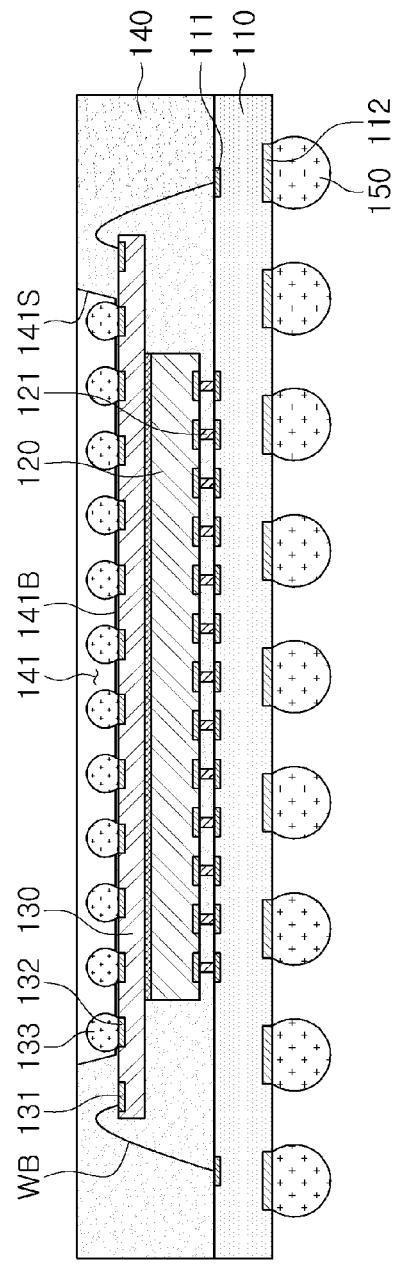

Referring to FIG. 8, lower connection terminals 150 may be formed on a plurality of second pads 112 disposed on a lower surface of the substrate 110. The lower connection terminals 150 may be formed using a reflow process, for example.

Figure 9:
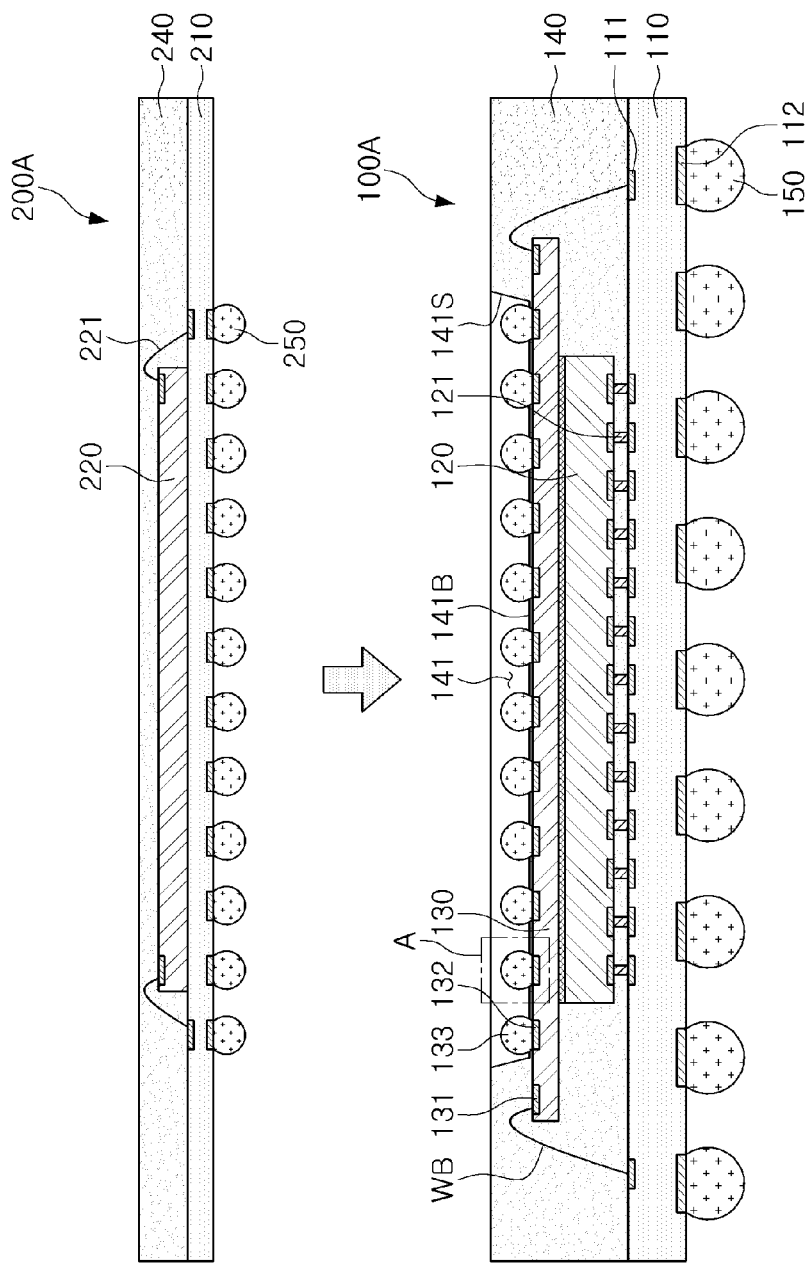
FIGS. 9 to 11 are side cross-sectional views illustrating a structure in which a second semiconductor package is coupled to a first semiconductor package illustrated in FIG. 1.
Figure 10:
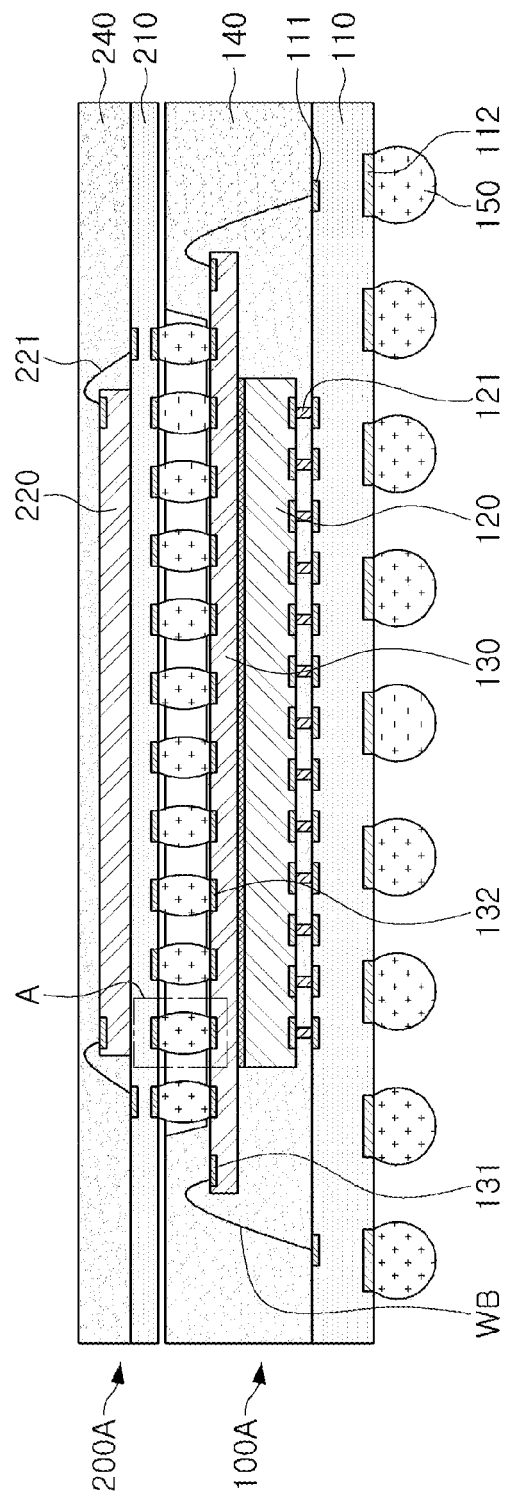
Figure 11:
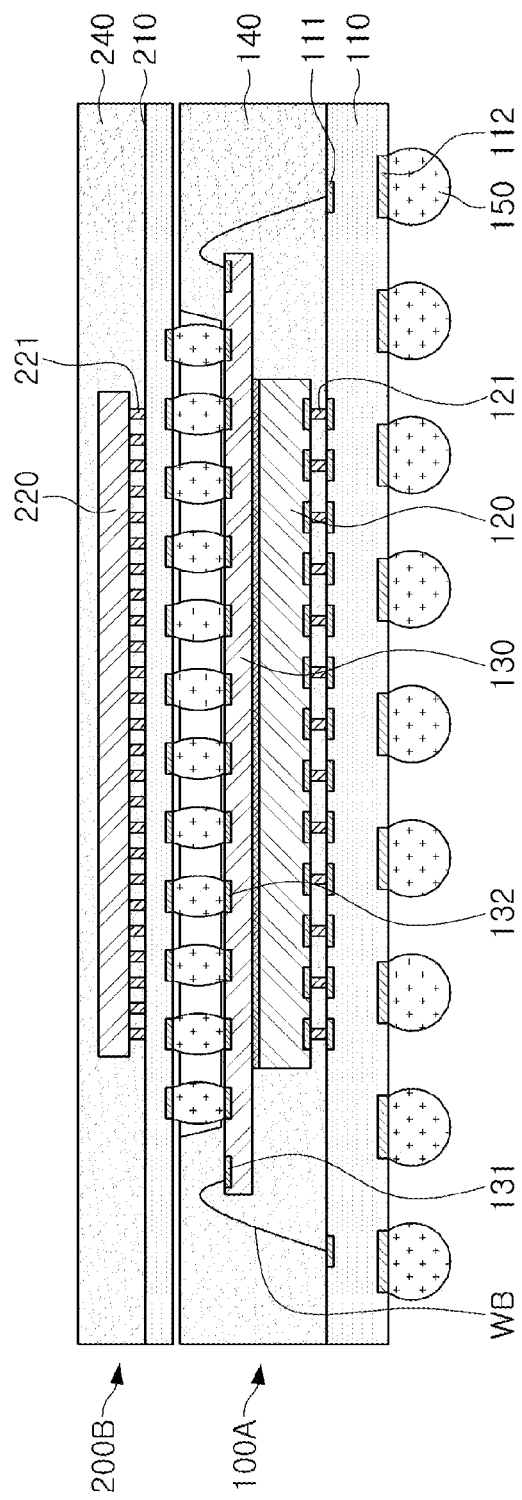

FIGS. 9 to 11 are side cross-sectional views illustrating a structure in which second semiconductor packages 200A and 200B are coupled to the first semiconductor package 100A illustrated in FIG. 1.

Referring to FIG. 9, a second semiconductor package 200A may include a second substrate 210, a second semiconductor chip 220, a second molding material 240, and second lower connection terminals 250. The second semiconductor chip 220 may be mounted on the second substrate 210 by a bonding wire 221, for example. The second lower connection terminals 250 of the second semiconductor package 200A may correspond to and may be physically/electrically connected to the first upper connection terminals 133 of the first semiconductor package 100A.

Referring to FIG. 10, in the region "A", the first upper connection terminals 133 and the second lower connection terminals 250 may be fused to each other using a reflow process, for example.

Referring to FIG. 11, in the second semiconductor package 200B, the second semiconductor chip 220 may be mounted on the second substrate 210 in a manner of a flip-chip. For example, the second connection members 221 may be disposed between the second semiconductor chip 220 and the second substrate 210.

FIGS. 12A, 12B, 13A, and 13B are cross-sectional views illustrating a state before (a) and after (b) fusion of a first upper connection terminal 133 and a second lower connection terminal 250 in portion "A" of FIGS. 9 and 10 to explain the effect due to a trench portion employed in an embodiment of the present disclosure.

Referring to FIGS. 12A and 12B, a maximum width W2 of a connection terminal C after fusion (FIG. 12B) of the first upper connection terminal 133 and the second lower connection terminal 250 may be further increased as compared with a maximum width W1 of the first upper connection terminal 133 before fusion (FIG. 12A) of the first upper connection terminal 133 and the second lower connection terminal 250.

The trench portion 141 may expose an upper region of the first upper connection terminal 133 and at least a portion of a lower region of the first upper connection terminal 133 based on a line L connecting maximum widths W1 of the first upper connection terminals 133, from the molding material 140. Accordingly, after fusion, an occupation space for the connection terminal C may be sufficiently secured.

In addition, when the first upper connection terminal 133 is a solder ball, the molding material 140 may have an opening 140H through which the first upper connection terminal 133 passes, and the maximum width HW of the opening 140H may be less than the maximum width W1 of the first upper connection terminal 133.

On the other hand, referring to FIGS. 13A and 13B, if each of the first upper connection terminals 133 is exposed through a via hole 141' passing through the molding material 140, a maximum width W3 of the connection terminal C after fusion (FIG. 13B) may be increased rapidly. In the example embodiment of FIGS. 13A and 13B, since the first upper connection terminal 133, molten in a reflow process, is in close contact with a wall 141'S of a tapered via hole 141' and comes up to an upper portion of the via hole 141', a maximum width W3 of the connection terminal C' after fusion of FIG. 13B may be further increased as compared with a maximum width W2 of the connection terminal C after fusion of FIG. 12B.

Figure 14:
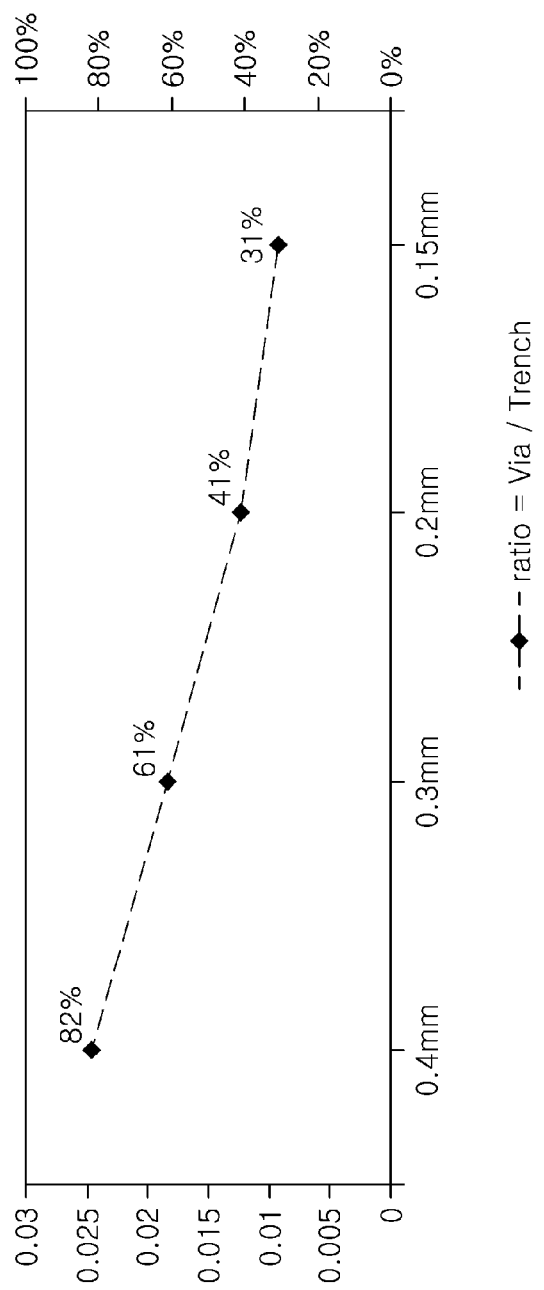
FIG. 14 is a graph illustrating a volume ratio in which a connection terminal could occupy in a via structure and a trench structure.

FIG. 14 is a graph illustrating a volume ratio (a via/a trench) in which a connection terminal could occupy in a via structure and a trench structure.

Referring to FIG. 14, when a distance between the first upper connection terminals 133 is about 0.4 mm, a volume of a via structure to a trench structure may be about 82%. When a distance between the first upper connection terminals 133 is about 0.2 mm, a volume of a via structure to a trench structure is reduced rapidly to about 41%.

Thus, when a distance between first upper connection terminals 133, disposed adjacently, is equal to or less than about 0.2 mm, an occupation space for a connection terminal fused by applying a trench structure is secured sufficiently, so shorting between the fused connection terminals may be prevented and/or suppressed from occurring.

Figure 15:
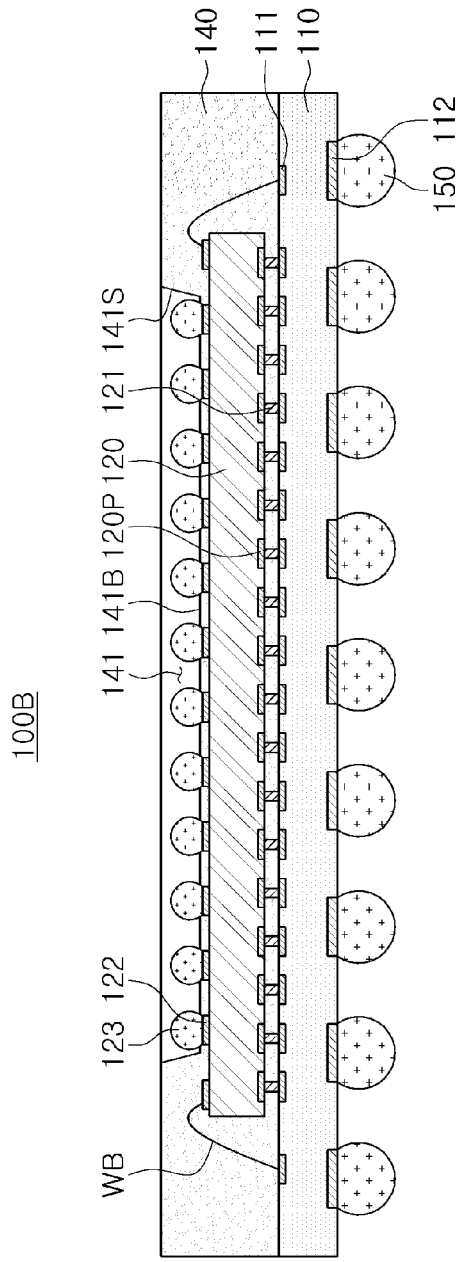
FIG. 15 is a side cross-sectional view illustrating a semiconductor package according to another embodiment of the present disclosure.
Figure 16:
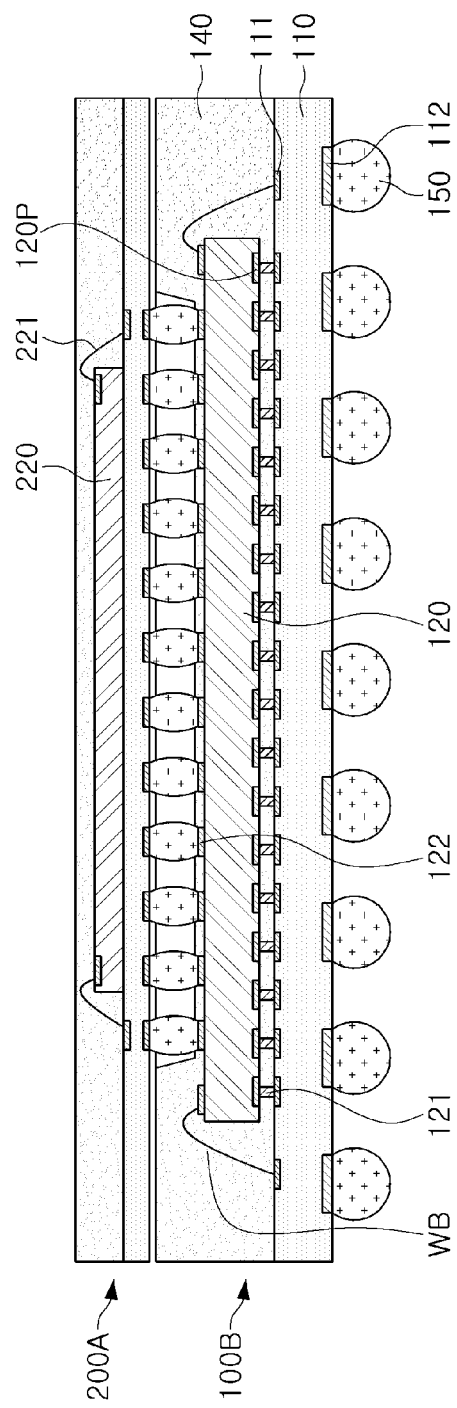
FIG. 16 is a side cross-sectional view illustrating a state in which a semiconductor package illustrated in FIG. 15 and a second semiconductor package are coupled to each other.

FIG. 15 is a side cross-sectional view illustrating a semiconductor package 100B according to another embodiment of the present disclosure, and FIG. 16 is a side cross-sectional view illustrating a second semiconductor package 200A coupled to the semiconductor package 100B illustrated in FIG. 15.

Referring to FIGS. 15 and 16, in a semiconductor package 100B according to another embodiment may have a lower surface provided with connection electrodes 120P and an upper surface provided with connection pads 122. In addition, a portion of the connection pads 122 may be connected to a first pad 111 of the substrate 110 by a bonding wire WB, while a remaining portion of the connection pads 122 may be connected to upper connection terminals 123. The upper connection terminals 123 may accommodate lower connection terminals of the second semiconductor package 200A. The description of the components of the present disclosure may be referred to in the description of the same or similar components of the semiconductor package 100A illustrated in FIG. 1, unless specifically explained otherwise.

Figure 17:
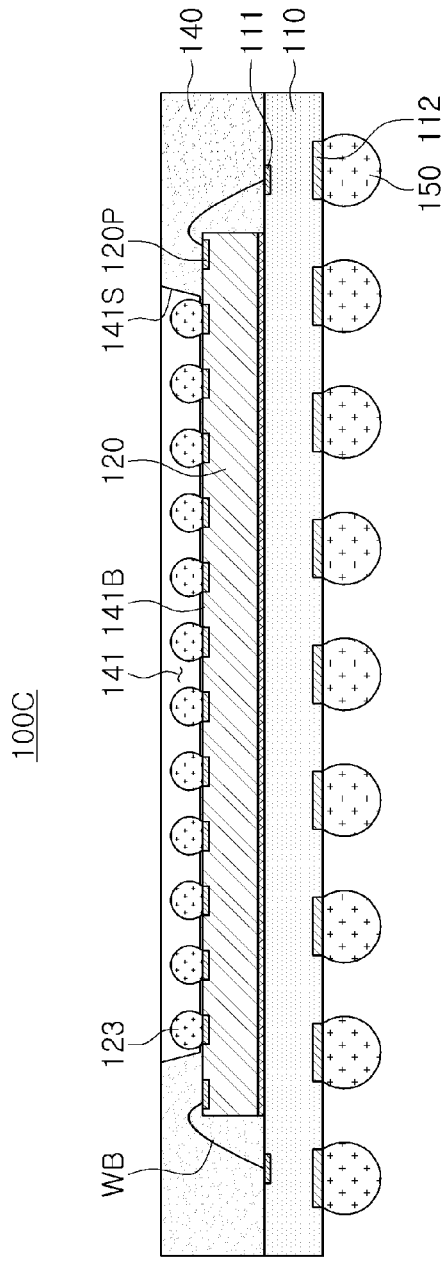
FIG. 17 is a side cross-sectional view illustrating a semiconductor package according to another embodiment of the present disclosure.
Figure 18:
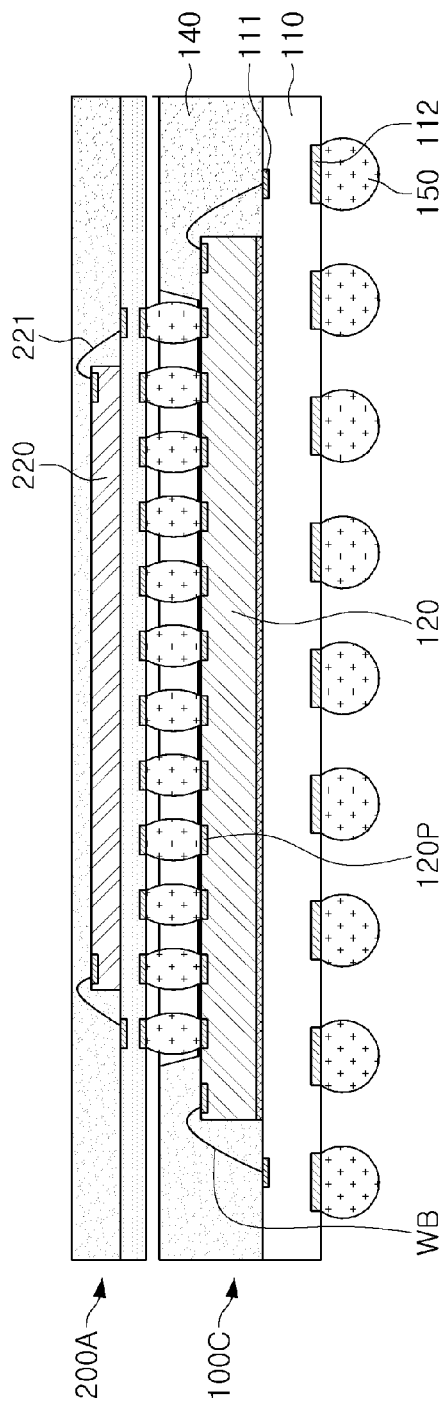
FIG. 18 is a side cross-sectional view illustrating a state in which a semiconductor package illustrated in FIG. 17 and a second semiconductor package are coupled to each other.

FIG. 17 is a side cross-sectional view illustrating a semiconductor package 100C according to another embodiment of the present disclosure, and FIG. 18 is a side cross-sectional view illustrating a second semiconductor package 200A coupled to the semiconductor package 100C illustrated in FIG. 17.

Referring to FIGS. 17 and 18, in a semiconductor package 100C according to another embodiment of the present disclosure, a semiconductor chip 120 may have an upper surface provided with connection electrodes 120P and a lower surface opposite to the upper surface and attached to the substrate 110. A portion of the connection electrodes 120P may be connected to a first pad 111 of the substrate 110 by a bonding wire WB, while a remaining portion of the connection electrodes 120P may be connected to upper connection terminals 123. The upper connection terminals 123 may accommodate lower connection terminals of the second semiconductor package 200A. The description of the components of the present disclosure may be referred to in the description of the same or similar components of the semiconductor package 100A illustrated in FIG. 1, unless specifically explained otherwise.

Figure 19:
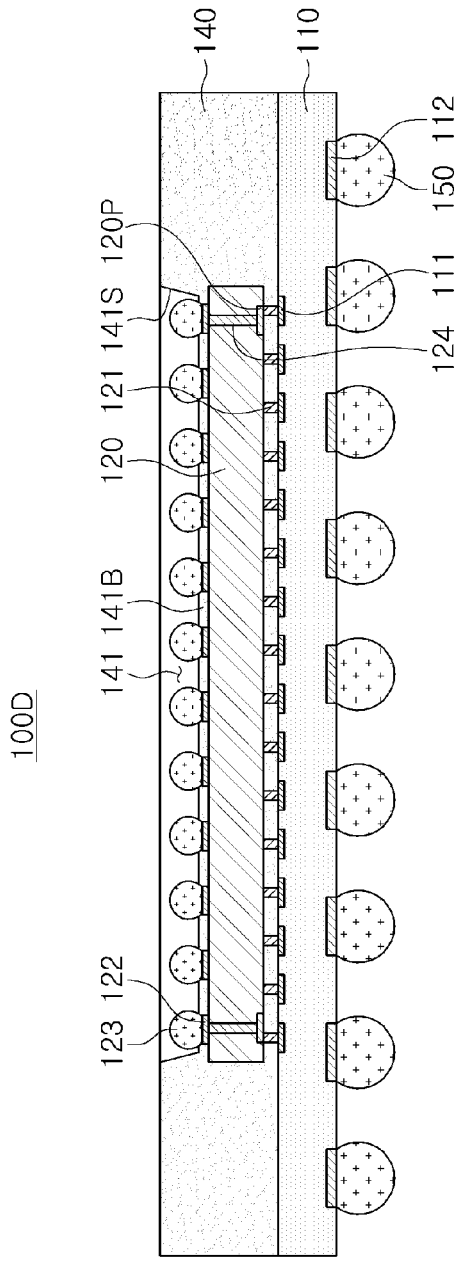
FIG. 19 is a side cross-sectional view illustrating a semiconductor package according to another embodiment of the present disclosure.
Figure 20:
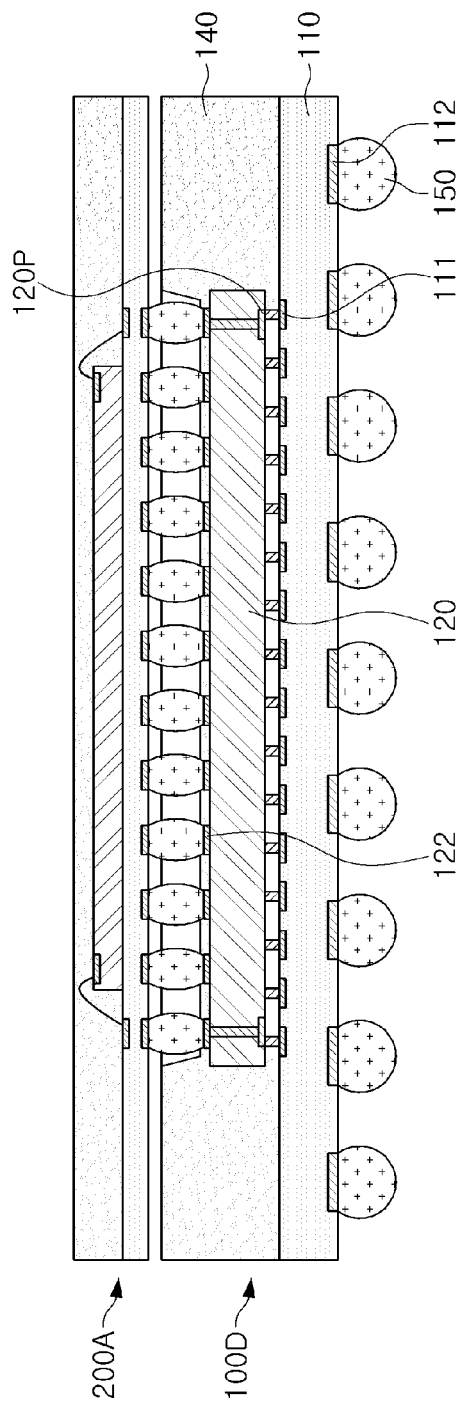
FIG. 20 is a side cross-sectional view illustrating a state in which a semiconductor package illustrated in FIG. 19 and a second semiconductor package are coupled to each other.

FIG. 19 is a side cross-sectional view illustrating a semiconductor package 100D according to another embodiment of the present disclosure, and FIG. 20 is a side cross-sectional view illustrating a second semiconductor package 200A coupled to the semiconductor package 100D illustrated in FIG. 19.

Referring to FIGS. 19 and 20, in a semiconductor package 100D according to another embodiment of the present disclosure, a semiconductor chip 120 may have a lower surface provided with connection electrodes 120P and an upper surface provided with connection pads 122, and may further include a through-electrode 124 connecting the connection electrodes 120P to the connection pads 122. The connection pads 122 may be connected to upper connection terminals 123. Thus, the upper connection terminals 123 may accommodate lower connection terminals of the second semiconductor package 200A, and may be electrically connected to the substrate 110 through a through-electrode 124 of the semiconductor chip 120. The description of the components of the present disclosure may be referred to in the description of the same or similar components of the semiconductor package 100A illustrated in FIG. 1, unless specifically explained otherwise.

As set forth above, according to example embodiments of the present inventive concept, a semiconductor package may be provided, capable of preventing and/or suppressing shorting between external connection terminals of a semiconductor package from occurring by introducing a trench portion securing an occupation space for the external connection terminal.

While example embodiments have been shown and described above, it will be apparent to those skilled in the art that modifications and variations could be made without departing from the scope of the present disclosure, as defined by the appended claims.

What is claimed is:

1. A semiconductor package, comprising:
    a substrate having an upper surface on which a plurality of first pads are disposed and a lower surface on which a plurality of second pads, electrically connected to the plurality of first pads, are disposed;
    a semiconductor chip disposed on the upper surface of the substrate, the semiconductor chip having a first surface on which connection electrodes connected to a first set of the plurality of first pads are disposed and a second surface opposite to the first surface;
    an interposer disposed on the second surface of the semiconductor chip, the interposer having an upper surface on which a plurality of first connection pads, connected to a second set of the plurality of first pads, and a plurality of second connection pads are disposed, the interposer having a lower surface opposite to the upper surface and facing the second surface of the semiconductor chip, and having a width greater than a width of the semiconductor chip in at least one direction;
    a plurality of connection terminals disposed on a set of the plurality of second connection pads of the interposer; and
    a molding material disposed on the upper surface of the substrate, the molding material covering at least the upper surface of the interposer, and having at least one trench portion exposing two or more adjacent connection terminals of the plurality of connection terminals,
    wherein in a side cross-sectional view a lower surface of the trench portion is located at a first level that is higher in elevation than a second level of a contact interface between the plurality of connection terminals and the plurality of second connection pads.

2. The semiconductor package of claim 1, wherein an uppermost surface of the molding material forms a step with a lower surface of the trench portion.

3. The semiconductor package of claim 1, wherein each connection terminal of the plurality of connection terminals is a solder ball,
    wherein the trench portion exposes an upper region of the plurality of connection terminals and at least a portion of a lower region of the plurality of connection terminals, and
    wherein the upper region of the plurality of connection terminals and the lower region of the plurality of connection terminals are delineated from one another based on a horizontal line connecting respective maximum widths of the plurality of connection terminals.

4. The semiconductor package of claim 1, wherein a wall of the trench portion connecting an uppermost surface of the molding material to a lower surface of the trench portion is spaced apart from an adjacently disposed connection terminal of the plurality of connection terminals.

5. The semiconductor package of claim 4, wherein the wall of the trench portion is tapered so as to be closer to the adjacently disposed connection terminal toward the lower surface of the trench portion than at the uppermost surface of the molding material.

6. The semiconductor package of claim 1, wherein the plurality of connection terminals are arranged in a plurality of rows, and
    the at least one trench portion includes a plurality of trenches arranged in the plurality of rows, respectively, and exposing the plurality of connection terminals disposed in the row.

7. The semiconductor package of claim 1, wherein the plurality of connection terminals are arranged in a form of at least one or more grids along an edge of the interposer, and
    the at least one trench portion includes a plurality of trenches arranged in the form of a grid and exposing the plurality of connection terminals disposed at the edge of the interposer.

8. The semiconductor package of claim 1, wherein the plurality of first connection pads are disposed adjacent to an edge of a plane of the interposer, and the plurality of second connection pads are disposed in a first region surrounded by the plurality of first connection pads on a plane of the interposer.

9. The semiconductor package of claim 8, wherein the plurality of first connection pads are connected to the second set of the plurality of first pads by wire bonding.

10. The semiconductor package of claim 8, wherein in a side cross-sectional view the plurality of first connection pads are disposed outside a second region vertically overlapping the semiconductor chip on the interposer.

11. The semiconductor package of claim 1, wherein a distance between a pair of connection terminals, disposed adjacent to each other, of the plurality of connection terminals, is equal to or less than 0.2 mm.

12. The semiconductor package of claim 1, wherein each pad of the plurality of first pads has a width less than a width of each pad of the plurality of second pads.

13. The semiconductor package of claim 1, wherein, connection members connecting the connection electrodes to at least a portion of the plurality of first pads are disposed between the first surface of the semiconductor chip and the upper surface of the substrate.

14. The semiconductor package of claim 1, wherein an attaching member is disposed between the second surface of the semiconductor chip and the lower surface of the interposer.

15. A semiconductor package, comprising:
a substrate having an upper surface and a lower surface, each of the upper surface and the lower surface being provided with a plurality of pads;
a semiconductor chip disposed on the upper surface of the substrate, and electrically connected to the substrate;
an interposer disposed on the semiconductor chip, and having an upper surface provided with a plurality of connection pads;
a plurality of connection terminals disposed on at least a first set of the plurality of connection pads of the interposer; and
a molding material disposed on the upper surface of the substrate, the molding material covering at least the upper surface of the interposer, and having at least one trench portion exposing the plurality of connection terminals,
wherein a second set of connection pads of the plurality of connection pads of the interposer, not provided with the plurality of connection terminals, are connected to the substrate,
wherein in a side cross-sectional view a lower surface of the trench portion is located at a first level that is higher in elevation than a second level of a contact interface between the plurality of connection terminals and the plurality of connection pads.

16. The semiconductor package of claim 15, wherein the plurality of connection terminals are arranged in a form of at least one or more grids along an edge of the interposer, and
the at least one trench portion includes a plurality of trenches arranged in the form of a grid and exposing the plurality of connection terminals disposed on the edge of the interposer.

17. The semiconductor package of claim 15, wherein a distance between a pair of connection terminals, disposed adjacent to each other, of the plurality of connection terminals, is equal to or less than 0.2 mm.

18. A semiconductor package, comprising:
a substrate having an upper surface and a lower surface, each of the upper surface and the lower surface being provided with a plurality of pads;
a semiconductor chip disposed on the upper surface of the substrate, and having an upper surface provided with a plurality of connection pads;
a plurality of connection terminals disposed on the upper surface of the semiconductor chip, and connected to at least a subset of the plurality of connection pads; and
a molding material having a trench portion covering at least the upper surface of the semiconductor chip and exposing at least a portion of the plurality of connection terminals,
wherein in a side cross-sectional view a lower surface of the trench portion is located at a first level that is higher in elevation than a second level of a contact interface between the plurality of connection terminals and the plurality of connection pads.

* * * * *